(12) United States Patent
Yamazaki et al.

(10) Patent No.: US 11,532,435 B2
(45) Date of Patent: Dec. 20, 2022

(54) THIN FILM CAPACITOR AND ELECTRONIC CIRCUIT BOARD

(71) Applicant: TDK CORPORATION, Tokyo (JP)

(72) Inventors: Kumiko Yamazaki, Tokyo (JP); Takeshi Shibahara, Tokyo (JP); Junichi Yamazaki, Tokyo (JP)

(73) Assignee: TDK CORPORATION, Tokyo (JP)

( * ) Notice: Subject to any disclaimer, the term of this patent is extended or adjusted under 35 U.S.C. 154(b) by 0 days.

(21) Appl. No.: 17/270,080

(22) PCT Filed: Aug. 27, 2019

(86) PCT No.: PCT/JP2019/033544
§ 371 (c)(1),
(2) Date: Feb. 22, 2021

(87) PCT Pub. No.: WO2020/045446
PCT Pub. Date: Mar. 5, 2020

(65) Prior Publication Data
US 2021/0241974 A1    Aug. 5, 2021

(30) Foreign Application Priority Data

Aug. 31, 2018   (JP) .............................. JP2018-163794

(51) Int. Cl.
*H01G 4/12* (2006.01)
*H01G 4/33* (2006.01)
(Continued)

(52) U.S. Cl.
CPC ........... *H01G 4/129* (2013.01); *H01G 4/1218* (2013.01); *H01G 4/1254* (2013.01); *H01G 4/33* (2013.01); *H05K 1/162* (2013.01); *H01G 4/008* (2013.01)

(58) Field of Classification Search
CPC .... H01G 4/1254; H01G 4/1218; H01G 4/129; H01G 4/33; H05K 1/162
See application file for complete search history.

(56) References Cited

U.S. PATENT DOCUMENTS

| 6,190,924 B1 * | 2/2001 | Lee ...................... H01L 28/56 438/3 |
| 2003/0184952 A1 * | 10/2003 | Baniecki ................ H01G 4/008 361/311 |

(Continued)

FOREIGN PATENT DOCUMENTS

| JP | 11177051 A * | 7/1999 | ............. H01L 28/56 |
| JP | 2001-307923 A | 11/2001 | |

(Continued)

OTHER PUBLICATIONS

Oka, D., Hirose, Y., Kamisaka, H. et al. Possible ferroelectricity in perovskite oxynitride SrTaO2N epitaxial thin films. Sci Rep 4, 4987 (2014). https://doi.org/10.1038/srep04987 (Year: 2014).*

(Continued)

*Primary Examiner* — David M Sinclair
(74) *Attorney, Agent, or Firm* — Oliff PLC

(57) ABSTRACT

A thin film capacitor for which electrode conductivity is high and electrode irregularities are unlikely to be generate even if the capacitor if heated up to 700° C. This thin film capacitor has a first electrode, a dielectric layer, and a second electrode. The dielectric layer contains an $ABO_2N$-type oxynitride. The nitrogen concentration of the part of the dielectric layer that contacts the first electrode is no more than half the nitrogen concentration of the center part of the dielectric layer.

5 Claims, 6 Drawing Sheets

(51) Int. Cl.
*H05K 1/16* (2006.01)
*H01G 4/008* (2006.01)

(56) References Cited

U.S. PATENT DOCUMENTS

| | | |
|---|---|---|
| 2007/0085166 A1 | 4/2007 | Moon et al. |
| 2010/0265632 A1* | 10/2010 | Saita .................. C04B 35/4682 361/321.5 |
| 2011/0287270 A1 | 11/2011 | Tsurumi et al. |
| 2013/0003254 A1* | 1/2013 | Koutsaroff ............. H01G 4/085 361/281 |
| 2017/0271080 A1 | 9/2017 | Tsurumi et al. |
| 2019/0023616 A1 | 1/2019 | Yamazaki et al. |

FOREIGN PATENT DOCUMENTS

| | | | | | |
|---|---|---|---|---|---|
| JP | 2007-116169 A | | 5/2007 | | |
| JP | 2007-150186 A | | 6/2007 | | |
| JP | 2013001625 A | * | 1/2013 | ....... | C04B 35/58014 |
| JP | 2014-051740 A | | 3/2014 | | |
| WO | 2017/135294 A1 | | 8/2017 | | |
| WO | WO-2017135296 A1 | * | 8/2017 | ......... | C01B 21/0821 |

OTHER PUBLICATIONS

Mar. 2, 2021 International Preliminary Report on Patentability issued in International Patent Application No. PCT/JP2019/033544.

* cited by examiner

THIN FILM CAPACITOR AND ELECTRONIC CIRCUIT BOARD

TECHNICAL FIELD

The present invention relates to a thin film capacitor and an electronic circuit board.

BACKGROUND

In recent years, as digital devices have achieved a higher performance, a thin film capacitor is also demanded to achieve a high performance. Further, it has been researched to use an $ABO_2N$ type oxynitride, which is a perovskite type oxynitride, as a dielectric layer.

In case of using the $ABO_2N$ type oxynitride as the dielectric layer, while forming the dielectric layer, heating is performed preferably around 700° C. or so in order to improve a dielectric property. However, depending on a material of an electrode, when heating is performed around 700° C. or so, roughness tends to form easily, thus a reliability decrease. Therefore, there is a demand for a thin film capacitor barely forming roughness even when heating is performed around 700° C. or so regardless of a material of the electrode.

Patent Document 1 discloses a thin film electronic component including metals with a high melting point in the electrode to prevent roughness. Patent Document 2 and Patent Document 3 disclose a thin film electronic component which does not heat to 700° C. or so while manufacturing the thin film electronic component.

[Patent Document 1] JP Patent Application Laid Open No. 2007-150186.
[Patent Document 2] JP Patent Application Laid Open No. 2001-307923
[Patent Document 3] JP Patent Application Laid Open No. 2007-116169

SUMMARY

The present invention is achieved in view of such circumstances and the object is to provide a thin film capacitor including an electrode with a high conductivity in which the electrode does not form roughness even when heating is performed at 700° C. or so.

The thin film capacitor according to the present invention includes a first electrode, a dielectric layer, and a second electrode, wherein
the dielectric layer includes an $ABO_2N$ type oxynitride, and a nitrogen concentration of the dielectric layer contacting the first electrode is half or less of a nitrogen concentration of a middle region of the dielectric layer.

As the thin film capacitor according to the present invention satisfies the above-mentioned constitution, roughness is rarely formed to the electrode (particularly to the first electrode) and a conductivity of the electrode increases.

In the thin film capacitor according to the present invention, a region of the dielectric layer contacting the first electrode may include an amorphous structure.

In the $ABO_2N$ type oxynitride, A may be one or more selected from Sr, Ba, Ca, La, Nd, Na, and K; and B may be one or more selected from Ta, Nb, Ti, and W.

The $ABO_2N$ type oxynitride represented by a compositional formula of $A_aB_bO_oN_n$ (a+b+o+n=5) may satisfy n<1.0.

The dielectric layer may include a buffer layer contacting the first electrode.

The buffer layer may include an A element and a B element of the $ABO_2N$ type oxynitride.

An A element content represented by a1 included in the buffer layer and a B element content represented by b1 included in the buffer layer may satisfy $1.0 \leq a1/b1 < 2.5$.

The first electrode may include a base metal.
The base metal may be Cu or Ni.
The base metal may be Cu.

DETAILED DESCRIPTION

Hereinbelow, an embodiment of the present invention is described.

Thin Film Capacitor

Figure 1:
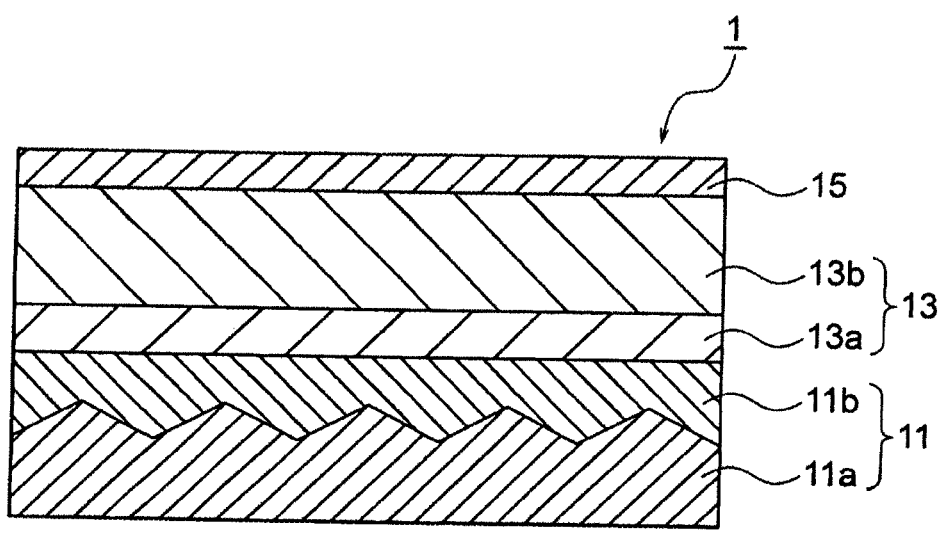
FIG. 1 is a schematic diagram of a thin film capacitor according to an embodiment of the present invention.

FIG. 1 shows a thin film capacitor according to the present embodiment. A thin film capacitor shown in FIG. 1 is formed in the order of a first electrode 11, a dielectric layer 13, and a second electrode 15.

A material of the first electrode 11 is not particularly limited as long as it functions as an electrode. For example, Pt, Au, Ni, Cu, and the like may be mentioned. In order to improve a conductivity, a base metal is preferably used as the material of the first electrode 11. As the base metal, Cu or Ni is preferably used. The reason for using Cu or Ni is because these are relatively inexpensive among base metals. Further, the first electrode 11 using Cu or Ni can be formed by spattering, thus the first electrode can have a wide range of use.

Also, as the base metal, more preferably Cu is used. Cu is less likely oxidized compared to Ni. Therefore, while forming the dielectric layer 13, the conductivity of the first electrode 11 can be maintained even under a high oxygen concentration. Further, even when the oxygen concentration is high, the dielectric layer 13 can be formed while maintaining the conductivity of the first electrode 11. Thus, it is advantageous from the point of giving an insulation property to the dielectric layer 13 of the thin film capacitor 1.

Note that, when Ni is used as the base metal, the dielectric layer 13 tends to have an appearance showing metal gloss. Also, when Pt is used as a precious metal, the dielectric layer 13 tends to have an appearance showing metallic gloss.

The first electrode 11 may be a single layer, or may be formed from two layers of a first electrode first layer 11a and a first electrode second layer 11b as shown in FIG. 1. When the first electrode 11 is made of a single layer, a metal foil may be used as the first electrode 11, or the first electrode 11 may be formed on a non-metallic substrate such as Si substrate and the like by spattering. When the first electrode 11 is formed of two layers, for example the first electrode second layer 11b formed with the dielectric layer may be formed on the first electrode first layer 11a by spattering.

A material of the second electrode 15 is not particularly limited as long as it functions as an electrode. For example, Pt, Ag, Ni, Cu, and the like may be mentioned.

A thickness of the first electrode 11 is preferably 0.01 to 10 μm. A thickness of the second electrode 15 is preferably 0.01 to 10 μm.

As shown in FIG. 1, the dielectric layer 13 according to the present embodiment may include a low nitrogen concentration layer 13a contacting the first electrode 11, and a high nitrogen concentration layer 13b.

In the thin film capacitor 1 according to the present embodiment, a nitrogen concentration of a region of the dielectric layer 13 contacting the first electrode 11 (the low nitrogen concentration layer 13a) is half or less a nitrogen concentration of a middle region of the dielectric layer 13 (the high nitrogen concentration layer 13b). A method of measuring the nitrogen concentration is not particularly limited. For example, an X-ray photoelectron spectroscopy, an impulse heat melting extraction method (an infrared absorbing method), and the like may be mentioned. Also, if the dielectric layer 13 is formed uniformly, the nitrogen concentration may be measured from one point in each of the region contacting the first electrode 11 and the middle region. However, preferably the nitrogen concentrations of three or more measurement points are measured from each of the regions, and an average thereof is taken.

Note that, the low nitrogen concentration layer 13a and the high nitrogen concentration layer 13b do not necessarily have to have a clear boarder in between, and the dielectric layer 13 may appear as a one single layer. However, since the nitrogen concentration of the region of the dielectric layer 13 contacting the first electrode 11 is half or less of the nitrogen concentration of the middle region of the dielectric layer 13, a negative influence caused by the above-mentioned heating treatment may be reduced.

As mentioned in above, in the thin film capacitor 1 according to the present embodiment, from the point of improving the conductivity of the first electrode 11, the first electrode 11 is preferably a base metal, more preferably the first electrode 11 is Cu or Ni, and even more preferably the first electrode 11 is Cu. However, in order to obtain the thin film capacitor 1 including the $ABO_2N$ type oxynitride described below, a heat treatment at high temperature of 700° C. or so is necessary when the dielectric layer 13 is formed. By performing the heat treatment for forming the dielectric layer 13, metal particles constituting the first electrode 11 may undergo re-crystallization and grain growth. Further, due to re-crystallization and grain growth of the metal particles, the first electrode 11 may uplift and deform. This uplifting and deformation of the first electrode 11 tends to easily occur when the first electrode 11 is made of the base metal, when it is Cu or Ni, uplifting and deformation tend to occur more easily; and tends to occur even more easily when it is Cu.

The present inventors have found that by providing the low nitrogen concentration layer 13a, it will function as a buffer layer between the first electrode 11 and the high nitrogen concentration layer 13b. Further, the present inventors have found that by providing the buffer layer, uplifting and deformation of the first electrode 11 due to the above-mentioned heat treatment can be reduced, and the thin film capacitor 1 can exhibit its function. Also, when the base metal included in the first electrode 11 is Cu, part of Cu contacting the low nitrogen concentration layer 13a is oxidized. Thereby, an adhesiveness between the first electrode 11 and the low nitrogen concentration layer 13a is improved.

A thickness of the dielectric layer 13 is not particularly limited. For example, it may be 10 nm to 1 μm. A thickness of the low nitrogen concentration layer 13a and a thickness of the high nitrogen concentration layer 13b are not particularly limited. For example, (the thickness of the low nitrogen concentration layer 13a)/(the thickness of the high nitrogen concentration layer 13b) may satisfy about 0.1 or less. The lower limit of the thickness of the low nitrogen concentration layer 13a is not particularly limited, and it may be very thin that the thickness cannot be observed. The nitrogen concentration of the region of the dielectric layer 13 contacting the first electrode 11 may be half or less of the nitrogen concentration of the middle region of the dielectric layer.

Also, the dielectric layer 13 includes an $ABO_2N$ type oxynitride (perovskite type oxynitride).

The $ABO_2N$ type oxynitride can be represented by a compositional formula of $A_aB_bO_oN_n$ (a+b+o+n=5). Also, since a ferroelectricity can be anticipated, preferably A is one or more selected from Sr, Ba, Ca, La, Nd, Na, and K; and preferably B is one or more selected from Ta, Nb, Ti, and W. Most preferably, A is Sr, and B is Ta. This is because the difference of thermal expansion coefficient between the Si substrate and $Sr_aTa_bO_oN_n$ is small and also even when the first electrode 11 is formed on the Si substrate by spattering, cracking rarely occurs.

On the other hand, the difference of the thermal expansion coefficient between $BaTiO_3$ and the Si substrate is large, hence cracking tends to easily occur while the first electrode 11 is formed on the Si substrate by spattering. While forming the dielectric layer 13, if the heating temperature is decreased and/or the heating time is shortened, cracking can be reduced, however $BaTiO_3$ may not sufficiently crystallize and it becomes difficult to obtain a sufficient dielectric property. Further, a temperature at which $BaTiO_3$ crystallizes is higher than a melting point of metal such as Cu and the like. Therefore, when a metal having a low melting point such as Cu and the like is used as the first electrode 11, it is difficult to obtain sufficient dielectric property when $BaTiO_3$ is used as the dielectric layer 13. Also, when $BaTiO_3$ is used as the dielectric layer 13, it is difficult to obtain a sufficient dielectric property while using a metal having a low melting point such as Cu and the like as the first electrode 11.

Note that, the nitrogen concentration (at %) of the dielectric layer 13 (the low nitrogen concentration layer 13a and the high nitrogen concentration layer 13b) roughly matches with an N atom ratio of the $ABO_2N$ type oxynitride when each layer includes the $ABO_2N$ type oxynitride. That is, when the $ABO_2N$ type oxynitride is represented by a compositional formula of $A_aB_bO_oN_n$ (a+b+o+n=5), the nitrogen concentration (at %) of the dielectric layer 13 mainly including the $ABO_2N$ type oxynitride is n×(100/5).

Further, in the $ABO_2N$ type oxynitride, usually n is $0.01<n<1.0$. Also, the $ABO_2N$ type oxynitride preferably has N content smaller than a stoichiometric amount. Specifically, n is preferably $n<1.0$. Further, n may be $0.01<n<1.0$. In this case, an insulation property of the dielectric layer 13 tends to easily improve.

Also, in the $ABO_2N$ type oxynitride, a total of an average valence of A site ions and an average valence of B site ions is 6.7 to 7.3. Preferably, a total of average valences is 7.

Here, the average valance is a value obtained by calculating an average of ion valences existing at A site and B site according to an abundance ratio. For example, below describes when A site includes Sr and La in a ratio of 4:1 and B site includes Ta and Ti in a ratio of 4:1. A valence of Sr ion is 2, and a valence of La ion is 3. Thus, when an average valence thereof is α, α is calculated by a below formula (1). Also, a valence of Ta ion is 5, and a valence of Ti ion is 4. Thus, when an average valence thereof is β, β is calculated by a below formula (2). In such case α=2.2, and β=4.8. Further, a total average valence represented by (α+β) is 7.

$$\alpha = \text{(a valence of } Sr \text{ ion)} \times \text{(an abundance ratio of } Sr \text{ ion)} + \quad \text{Formula (1)}$$
$$\text{(a valence of } La \text{ ion)} \times \text{(an abundance ratio of } La \text{ ion)}$$
$$= 2 \times 4/5 + 3 \times 1/5$$
$$= 2.2$$

$$\beta = \text{(a valence of } Ta \text{ iob)} \times \quad \text{Formula (2)}$$
$$\text{(an abundance ratio of } Ta \text{ ion)} +$$
$$\text{(a valence of } Ti \text{ ion)} \times$$
$$\text{(an abundance ratio of } Ti \text{ ion)}$$
$$= 5 \times 4/5 + 4 \times 1/5$$
$$= 4.8$$

Note that, when a total average valence of the present embodiment is calculated, even in case of A site rich or B site rich, that is even when a/b≠1, it is handled as a/b=1. For example, in above case, when a/b=1.2, a total average valence is 2.2+4.8=7.

In the present embodiment, at least the high nitrogen concentration layer 13b includes the $ABO_2N$ type oxynitride (perovskite type oxynitride). However, the low nitrogen concentration layer 13a does not necessarily include the $ABO_2N$ type oxynitride. Note that, the low nitrogen concentration layer 13a does not have to include nitrogen.

The low oxygen concentration layer 13a preferably at least includes the A element and the B element of the $ABO_2N$ type oxynitride. By including the A element and the B element, the adhesiveness between the low nitrogen concentration layer 13a and the high nitrogen concentration layer 13b improves. Also, the A element content included in the low nitrogen concentration layer 13a represented by a1 and the B element content included in the low nitrogen concentration layer 13a represented by b1 preferably satisfy 1.0≤a1/b1≤2.5 in terms of an atomic ratio, and more preferably satisfy 1.0≤a1/b1≤2.3.

A method for measuring the composition of the $ABO_2N$ type oxynitride is not particularly limited. For example, X-ray photoelectron spectroscopy, an impulse heat melting extraction method (an infrared absorbing method), and the like may be mentioned.

Also, the high nitrogen concentration layer 13b includes the $ABO_2N$ type oxynitride, and the $ABO_2N$ type oxynitride usually includes a perovskite type crystal structure. Further, usually an amorphous structure is not included. On the other hand, the low nitrogen concentration layer 13a preferably includes an amorphous structure. As the low nitrogen concentration layer 13a includes an amorphous structure, the N concentration of the low nitrogen concentration layer 13a decreases, and part of Cu included in the first electrode 11 is oxidized thus the adhesiveness between the first electrode 11 and the low nitrogen concentration layer 13a is improved. Note that, the low nitrogen concentration layer 13a may include a perovskite type crystal structure as similar to the high nitrogen concentration layer 13b. A method for verifying an amorphous structure included in the low nitrogen concentration layer 13a and the high nitrogen concentration layer 13b is not particularly limited. For example, it can be verified by XRD pattern.

Figure 5:
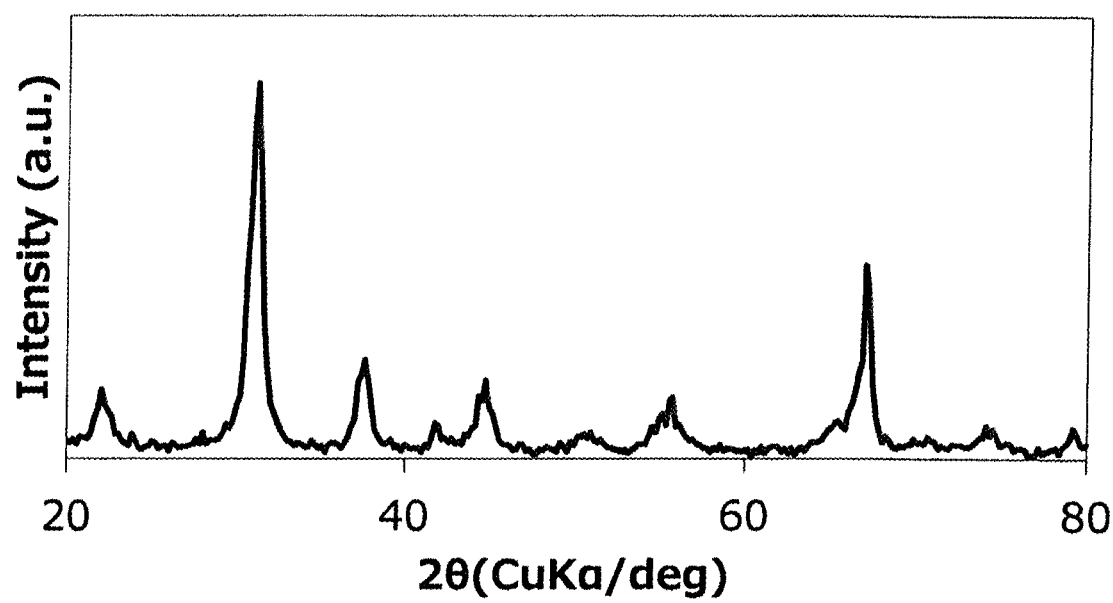
FIG. 5 is one example of XRD pattern of a dielectric layer made of a crystal structure.
Figure 6:
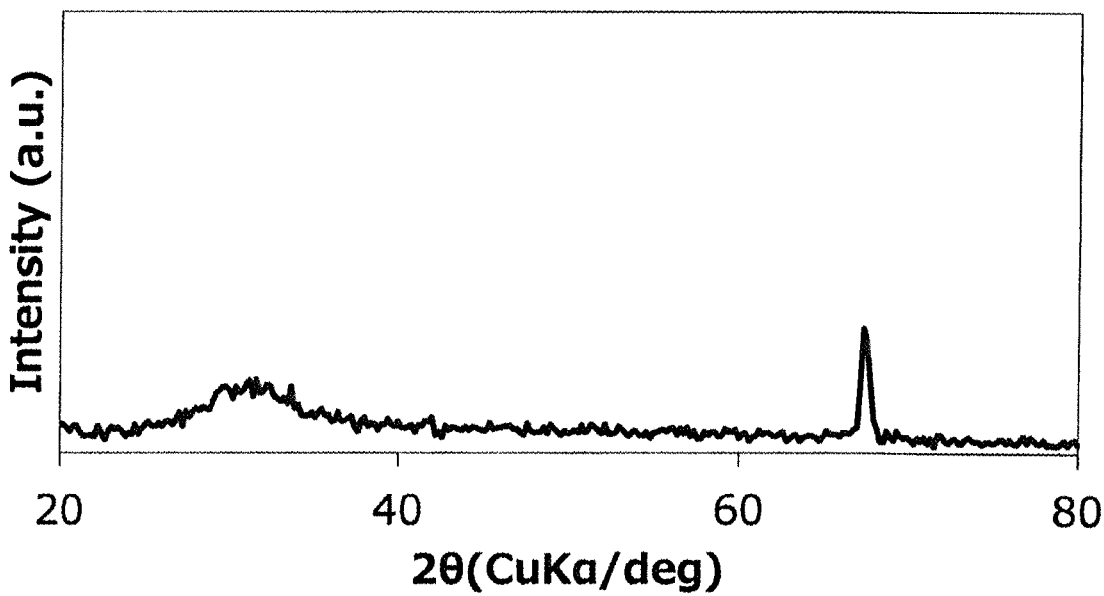
FIG. 6 is one example of XRD pattern of a dielectric layer made of a amorphous structure.

For example, when the dielectric layer is made of a perovskite type crystal structure, XRD pattern as shown in FIG. 5 is obtained. Sharp peaks are found at a plurality of 2θ. On the other hand, when the dielectric layer is formed of an amorphous structure, the XRD pattern shown in FIG. 6 is obtained. A broad peak is observed. In FIG. 5 and FIG. 6, a peak observed around 65 to 70 deg is a peak of an Ag electrode formed by deposition. Note that, FIG. 5 shows the XRD pattern of the dielectric layer obtained by forming a Pt electrode as the first electrode on the Si substrate and then forming the dielectric layer on the Pt electrode at a substrate temperature of 700° C. FIG. 6 is an XRD pattern of a dielectric layer obtained by forming a Pt electrode as the first electrode on the Si substrate and then forming the dielectric layer on the Pt electrode at a substrate temperature of room temperature.

Electronic Circuit Board

Figure 7:
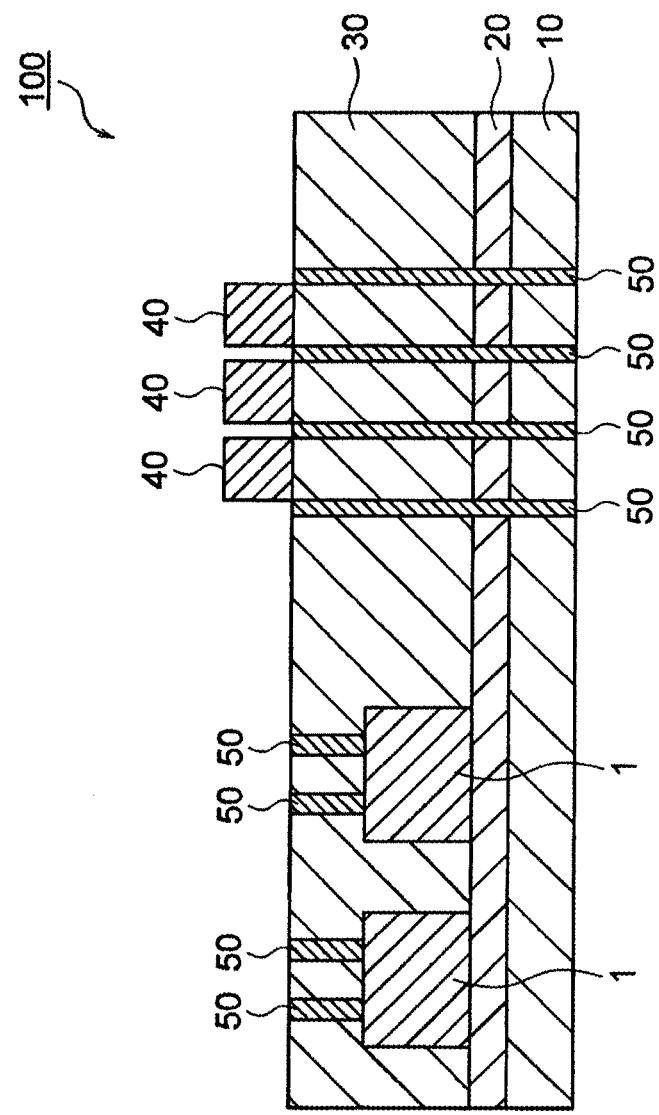
FIG. 7 is a schematic cross section of an electronic circuit board according to one embodiment of the present invention.

As shown in FIG. 7, the electronic circuit board 100 according to the present embodiment includes an epoxy based resin substrate 10, a resin layer 20 formed on the epoxy based resin substrate 10, a thin film capacitor 1 provided on the resin layer 20, an insulation coating layer 30 formed on the resin layer 20 provided with the thin film capacitor 1, an electronic component 40 provided on the insulation coating layer 30, and a metal wire 50 connecting to the thin film capacitor 1 or the electronic component 40 and pulled out to a surface of the epoxy based resin substrate 10 or to a surface of the insulation coating layer 30. A part of the metal wire 50 penetrates through the electronic circuit board 100 in order to conduct between the surface of the epoxy based resin substrate 10 and the surface of the insulation coating layer 30. A type of the metal wire 50 is not particularly limited. For example, the metal wire 50 may be Cu and the like. In the embodiment shown in FIG. 7, the thin film capacitor 1 is embedded inside the electronic circuit board 100.

Method for Producing Thin Film Capacitor 1

Next, the method for procuring the thin film capacitor 1 is described. Hereinbelow, Sr is used as the A site atom and Ta is used as the B site atom for explaining, however the same applies even in case of using other type of elements.

The method for producing the thin film capacitor 1 according to the present embodiment includes steps of preparing the first electrode 11, forming the dielectric layer 13 on the first electrode 11, and forming the second electrode 15 on the dielectric layer 13.

First, the step of preparing the first electrode 11 is described. When a metal foil (for example Ni foil and the like) is used as the first electrode 11, the metal foil may be prepared. Also, when the first electrode 11 is formed on the non-metallic substrate such as the Si substrate and the like by spattering, $SiO_2$, $TiO_x$, and the first electrode 11 is formed in this order on the Si substrate (for example, Si single crystal substrate). A method for forming the first electrode 11 is not particularly limited. For example, a spattering method, a CVD method, and the like may be mentioned.

Next, a method for forming the dielectric layer 13 on the first electrode 11 is described. For example, a method for forming the dielectric layer 13 made of a metal oxide thin film on the first electrode 11 by a PLD method may be mentioned. Also, a region which is not formed with the thin film may be formed by using a metal mask to expose a part of the first electrode 11.

A method for forming the thin film which becomes the dielectric layer 13 at the end is not particularly limited. For example, a vacuum deposition method, a spattering method, a PLD method (pulse laser deposition method), a MO-CVD method (organic metal chemical vapor deposition method), a MOD method (organic metal decomposition method), a sol-gel method, a CSD method (chemical solution deposition method), and the like may be mentioned. Also, trace amounts of impurities and subcomponents may be included in raw materials used for forming the dielectric layer as long as it does not significantly compromise the performance of the thin film. Also, the dielectric layer 13 according to the present embodiment may include trace amounts of impurities and subcomponents as long as it does not significantly compromise the performance of the thin film.

Among the above-mentioned method for forming the thin film, when a PLD method, a spattering method, a CSD method, and the like are used as the method for forming the thin film; the thin film obtained at the end tends to easily form a polycrystalline film. That is, the dielectric layer 13 (particularly the high nitrogen concentration layer 13b) tends to easily include the $ABO_2N$ type oxynitride. Also, when the dielectric layer 13 according to the present embodiment is formed by a method such as a PLD method, a spattering method, a CSD method, and the like, N tends to easily take cis position. The dielectric layer is possible to form by a CVD method, but since a number of component elements is too many, a higher composition controllability can be attained by a PLD method and a spattering method. In the present embodiment, a PLD method as a method for forming the thin film is explained.

In a PLD method, first, a target including constitutional elements of the dielectric layer 13 is placed inside a film forming chamber. Then, pulse laser is irradiated to a surface of the target. Due to strong energy of the pulse laser, the surface of the target is evaporated instantaneously. Thereby, the evaporated materials are deposited to the substrate which is placed facing against the target, and the metal oxide thin film is formed.

A type of the target is not particularly limited, besides metal oxide sintered body including the constitutional elements of the dielectric layer 13, an alloy, a nitride sintered body, a metal oxynitride sintered body, and the like can be used. Also, in the target, preferably each element is evenly distributed, however the distribution of each element may vary within a range which does not influence the quality of the obtained dielectric layer 13. Further, the target does not necessarily have to be one, and plurality of targets including parts of the constitutional elements of the dielectric layer 13 can be used for forming. A shape of the target is not particularly limited, and it may be a shape suited for a film forming machine being used. Also, by regulating film forming conditions (oxygen gas pressure, nitrogen gas pressure, size of a film forming chamber, a position of a gas injection pipe, and the like), a/b of the $ABO_2N$ type oxynitride included in the dielectric layer 13 obtained at the end can be controlled. For example, if a/b of the target is increased, a/b in the formed film can be increased. Also, not only a/b of the target, but also the film forming conditions are also important. This is because the metal element evaporated from the target due to pulse laser reaches to the first electrode 11 while being influenced by elements constituting the atmosphere inside the film forming chamber.

For example, when a composition of the $ABO_2N$ type oxynitride included in the dielectric layer 13 obtained at the end is $Sr_aTa_bO_oN_n$, a sintered body including $Sr_2Ta_2O_7$ is prepared as the target. Further, by regulating the film forming conditions (for example, oxygen gas pressure, nitrogen gas pressure (amount of nitrogen radicals), size of a film forming chamber, a position of a gas injection pipe, and the like), the composition of the dielectric layer 13 obtained at the end can be controlled.

In general, when a PLD method is used, in order to crystalize the $ABO_2N$ type oxynitride included in the dielectric layer 13 to be formed, the first electrode 11 is heated while forming the dielectric layer. A method of heating is not particularly limited. For example, an infrared laser can be used. Also, the first electrode 11 may be indirectly heated by heating the non-metallic substrate such as the above-mentioned Si substrate, or the first electrode 11 may be directly heated. Further, by heating the first electrode 11 for example at a film forming temperature of 600° C. to 800° C., the $SrTaO_2N$ type oxynitride tends to easily crystallize. Further, by introducing nitrogen radicals to perform a nitriding treatment while forming the dielectric layer, thereby the dielectric layer 13 including the $ABO_2N$ type oxynitride can be obtained. The nitriding treatment may be performed by introducing nitrogen radicals after forming the metal oxide film. However, the nitrogen amount in the obtained thin film can be even more increased when nitrogen radicals are introduced while forming the dielectric layer. Here, the nitrogen amount in the obtained thin film can be verified by an X-ray photoelectron spectroscopy. Regarding the quantification of nitrogen, the internal standard of an X-ray photoelectron spectroscopy can be used, however a quantified amount is adjusted preferably by calculating a sensitivity factor from a nitride single crystal such as MN and the like.

However, in the present embodiment, in order to form the low nitrogen concentration layer 13a, first the low nitrogen concentration layer 13a is formed at a temperature of 200° C. or less. Further, the temperature of the first electrode 11 is increased at a constant temperature increasing rate until the temperature reaches to a film forming temperature.

By starting the formation of the low nitrogen concentration layer 13a at a temperature of 200° C. or lower, the first electrode 11 barely crystallizes, and roughness is rarely formed before forming the low nitrogen concentration layer 13a. Also, when the dielectric layer 13 is formed at a temperature of 500° C. or lower, a nitriding treatment becomes difficult to proceed even when nitrogen radicals are introduced while forming the dielectric layer 13, and the nitrogen concentration of the dielectric layer 13 decreases. That is, the dielectric layer 13 formed while the temperature of the first electrode 11 is 500° C. or lower has a low nitrogen content and becomes the low nitrogen concentration layer 13a. Further, in the dielectric layer 13 formed while the temperature of the first electrode 11 is 500° C. or higher, a nitriding reaction proceeds, and crystallization of the $ABO_2N$ type oxynitride proceeds. Thereby, the high nitrogen concentration layer 13b having a high content of nitrogen is formed.

The high nitrogen concentration layer 13b of the dielectric layer 13 obtained by the above-mentioned method includes a perovskite type crystal structure. Usually, the high nitrogen concentration layer 13b does not include an amorphous structure. However, the low nitrogen concentration layer 13a may include an amorphous structure. The low nitrogen concentration layer 13a is an amorphous structure when it is first formed. However, crystallization of the low nitrogen concentration layer 13a including amorphous structure proceeds by heating at a predetermined film forming temperature. Hence, if heating at a predetermined film forming temperature is too long, an amorphous structure may not remain in the low nitrogen concentration layer 13a. On the other hand, crystallization of the low nitrogen concentration layer 13a including amorphous structure may not proceed completely and in some case the amorphous structure may remain.

In the above-mentioned method, the dielectric layer 13 is formed in a one-step, however the dielectric layer may be formed in two steps. Specifically, the low nitrogen concentration layer 13a made of $SrTaO_{3.5}$ type oxide having an amorphous structure can be formed at a temperature of 200° C. or less without introducing nitrogen radicals; then the high nitrogen concentration layer 13b made of $SrTaO_2N$ type oxynitride having a crystal structure can be formed by introducing nitrogen radicals while heating the first electrode 11 at a high temperature of 500° C. or higher.

As mentioned in above, in either case of forming the dielectric layer 13 in one-step or in two-steps, the dielectric layer 13 according to the present embodiment is formed in the order of the step of forming at a temperature of 200° C. or lower and the step of forming at 500° C. or higher.

The method for forming the dielectric layer 13 according to the present embodiment is not particularly limited as long as the step of forming at a temperature of 200° C. or lower and the step of forming at 500° C. or higher are performed in this order. The nitrogen concentration of the low nitrogen concentration layer 13a obtained at the end is half or less of the nitrogen concentration of the high nitrogen concentration layer 13b.

Lastly, by forming the second electrode 15 on the dielectric layer 13, the thin film capacitor 1 can be produced. Note that, a method for forming the second electrode 15 is not particularly limited. For example, it can be formed by methods such as a spattering method, a deposition method, and the like.

Note that, the roughness of the first electrode 11 can be evaluated by an outer appearance of the dielectric layer 13. The outer appearance of the dielectric layer 13 can be verified for example by observation using a microscope at a magnification of 500× to 1000×.

Also, the surface roughness of the first electrode 11 can not be measured by a contact type surface roughness tester or by a non-contact type surface roughness tester which are conventionally used. This is because the surface of the first electrode 11 is in contact with the dielectric layer 13. Here, the roughness of the first electrode 11 can be evaluated by quantifying the surface roughness of the dielectric layer 13 of the first electrode 11 side. The surface roughness of the dielectric layer 13 of the first electrode 11 side is correlated with the surface roughness of the first electrode 11.

Figure 4:
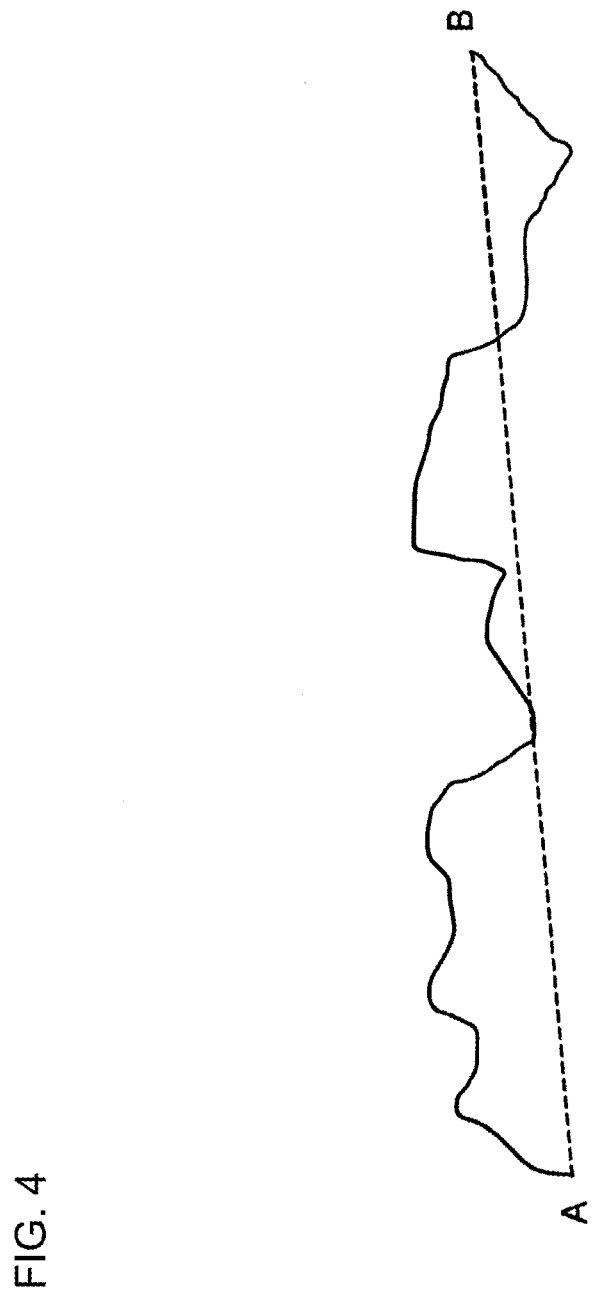
FIG. 4 is a schematic diagram showing a method of measuring a surface roughness of a dielectric layer.

Hereinafter, a method of quantifying the surface roughness is explained using FIG. 4. First, a sample including the first electrode 11 and the dielectric layer 13 is cut along a cross section parallel to a thickness direction of the dielectric layer 13. Next, the cross section is observed using SEM: scanning electron microscope or TEM: transmission electron microscope at a magnification of 10000× to 50000×. Thereby, a boundary between the dielectric layer 13 and the first electrode 11 is identified. Next, two points on the boundary are determined (point A and point B of FIG. 4). Note that, preferably the length between the two points (indicated by a broken line in FIG. 4) is preferably long so that variation of the measurement results can be suppressed. Specifically, the length of the straight line between the two points is 500 nm or more, and more preferably it is 1 μm or more. Further, the length of the boundary between the two points (L1) and the length of straight line between two points (L2) are calculated, and the surface roughness of the dielectric layer 13 of the first electrode 11 side can be obtained from $\{(L1-L2)/L2\} \times 100$. Note that, a method for measuring the length of L1 and L2 is not particularly limited. Particularly, L 1 can be calculated using an image software, or the boundary may be divided into short lines and then these may be cumulated.

Method for Producing Electronic Circuit Board

The electronic circuit board 100 is produced for example by a below method, however it is not limited thereto. First, a pre-cured resin layer which is a precursor of the resin layer 20 is formed to an epoxy based resin substrate 10. Further, the thin film capacitor 1 is mounted on the pre-cured resin layer so that the pre-cured resin layer and the first electrode 11 of the thin film capacitor 1 face against each other. Next, the insulation coating layer 30 is formed on the pre-cured resin layer mounted with the thin film capacitor 1, and the thin film capacitor 1 is placed between the epoxy based resin substrate 10 and the insulation coating layer 30. Next, the resin layer 20 is formed by heat curing the pre-cured resin layer, and also the epoxy based resin substrate 10 and the insulation coating layer 30 are press adhered. A method of press adhesion is not particularly limited. For example, it may be a method by heat pressing. Next, a through hole is formed, and a metal wire 50 is formed in the through hole, then the electronic component 40 is mounted on the insulation coating layer 30. Thereby, an electronic circuit board 100 embedded with the thin film capacitor 1 inside is obtained. Note that, the pre-cured resin layer may be formed by a B stage epoxy resin and the like which is in a pre-cured state at room temperature and heat cures by heating. Also, the insulation coating layer 30 may be formed from a resin such as an epoxy resin, Teflon (registered trademark) based resin, a polyimide resin, or the like.

Hereinabove, the embodiment of the present invention is described, however the present invention is not limited to such embodiment and various modifications can be performed within the scope of the present invention. For example, the thin film capacitor 1 of the electronic circuit board 100 may be mounted by surface mounting.

EXAMPLES

Hereinafter, the present invention is described based on further specific examples and the present invention is not limited thereto.

First, as raw materials of $Sr_2Ta_2O_7$ sintered body used as a target for forming thin film, a $SrCO_3$ powder and a $Ta_2O_5$ powder were prepared. The $SrCO_3$ powder and the $Ta_2O_5$ powder were weighed so that a molar ratio of Sr/Ta was 1.

Next, the $SrCO_3$ powder and the $Ta_2O_5$ powder were mixed for 16 hours by a wet ball mill using an ethanol solvent, thereby a mixed slurry was obtained.

Then, the mixed slurry was dried for 12 hours at 80° C. by a constant temperature dryer, thereby a mixed product was obtained.

Next, the mixed product was lightly crushed in a mortar, then placed in a ceramic crucible. Then, a heat treatment was carried out for 2 hours at 1000° C. under air atmosphere using an electric furnace. Thereby, a calcined product was obtained.

Next, the calcined product was crushed in a mortar, and then finely pulverized for 16 hours by a wet ball mill using water or ethanol as a solvent, thereby a calcined slurry was obtained.

The obtained calcined slurry was dried for 12 hours at 80° C. in a constant temperature dryer, thereby a calcined mixed product was obtained.

To the calcined mixed product, a polyvinyl alcohol solution as a binder was added and mixed, thereby a granulated powder was obtained. An added amount of the polyvinyl alcohol solution was 0.6 wt % with respect to 100 wt % of a granulated powder.

The granulated powder was molded into a circular disk shape having a diameter of about 23 mm and a thickness of about 9 mm, thereby a molded article was obtained. As a molding method, a CIP method was used.

The molded article was subjected to a binder removal treatment at 1400° C. for 2 hours, thereby a sintered product was obtained. Further, upper and lower surfaces of the sintered product were mirror polished and the target for forming thin film having a height of 5 mm was obtained. Note that, an obtained target for forming thin film had a relative density of 96 to 98%.

The target for forming thin film as mentioned in above was placed in a film forming device.

Example 1

In Example 1, a Ni foil was provided so that it faced against the target for forming thin film. Then, the dielectric layer was formed by a PLD method so that the thickness was 300 nm. The oxygen gas was not introduced while forming the dielectric film, and nitrogen radicals were only introduced to form $SrTaO_2N$ type oxynitride. Also, the temperature of the Ni foil at the beginning of the formation of the dielectric layer was room temperature, and then it was heated to 700° C. once the formation of the dielectric layer started at a temperature increasing rate of 1400° C./h. Then, the dielectric layer was formed for 30 minutes while maintaining the temperature at 700° C. Once the dielectric layer was formed, heating was also stopped, and the temperature was decreased to room temperature by natural heat dissipation.

Note that, a composition of a $SrTaO_2N$ type oxynitride in a low nitrogen concentration layer and a high nitrogen concentration layer of Example 1 was quantified by an X-ray photoelectron spectroscopy using PHI Quantera II™ made by ULVAC-PHI, Inc. The composition of a $SrTaO_2N$ type oxynitride in the low nitrogen concentration layer and the high nitrogen concentration layer represented by a compositional formula of $A_aB_bO_oN_n$ (a+b+o+n=5) satisfied o>2.0 and n<1.0.

Example 2

In Example 2, a Si substrate was prepared which was formed with a first electrode made of Cu by spattering, and then the first electrode was provided so that it faced against the target for forming thin film. Then, the dielectric layer was formed so that a thickness was 400 nm by a PLD method. While forming the dielectric layer, oxygen gas (oxygen partial pressure $2\times10^{-3}$ Pa) and nitrogen radicals were introduced and a $SrTaO_2N$ type oxynitride was formed. Also, a temperature of the Si substrate at the beginning of the formation of the dielectric layer was room temperature, and then it was heated to 700° C. once the dielectric layer started to form at a temperature increasing rate of 1400° C./h. Then, the dielectric layer was formed for 2 hours while maintaining the temperature at 700° C. Once the dielectric layer was formed, heating was also stopped, and the temperature was decreased to room temperature by natural heat dissipation.

Note that, a composition of a $SrTaO_2N$ type oxynitride in a low nitrogen concentration layer and a high nitrogen concentration layer of Example 2 was quantified by an X-ray photoelectron spectroscopy. The composition of the $SrTaO_2N$ type oxynitride in the low nitrogen concentration layer and the high nitrogen concentration layer represented by a compositional formula of $A_aB_bO_oN_n$ (a+b+o+n=5) satisfied o>2.0 and n<1.0.

Example 3

In Example 3, a Si substrate formed with a first electrode made of Pt by spattering was prepared, and the first electrode was provided so as to face against the target for forming thin film. Further, a low nitrogen concentration layer having an amorphous structure was formed so that the thickness was 30 nm. While forming the low nitrogen concentration layer, nitrogen radicals were not introduced and oxygen gas (oxygen partial pressure $2\times10^{-3}$ Pa) was only introduced. Thereby, a $SrTaO_3$ type oxynitride was formed. Here, the temperature was at room temperature. A length of time for forming the low nitrogen concentration layer was 10 minutes. Next, a high nitrogen concentration layer having a crystal structure was formed so that the thickness was 400 nm. While forming the high nitrogen concentration layer, oxygen gas and nitrogen radicals were introduced, thereby a $SrTaO_2N$ type oxynitride was formed. In this example, the Si substrate formed with the first electrode and the low nitrogen concentration layer was heated to 700° C. in advance and then the formation of the high nitrogen concentration layer was started. A length of time for forming the high nitrogen concentration layer was 2 minutes. Once the high nitrogen concentration layer was formed, heating was also stopped and the temperature was decreased to room temperature by natural heat dissipation.

Note that, in Example 3, a composition of the $SrTaO_3$ type oxynitride in the low nitrogen concentration layer, and a composition of the $SrTaO_2N$ type oxynitride in the high nitrogen concentration layer were quantified by an X-ray photoelectron spectroscopy. The composition of the $SrTaO_2N$ type oxynitride in the low nitrogen concentration layer was $Sr_{1.4}Ta_{0.59}O_{2.73}$. The $SrTaO_2N$ type oxynitride in the low nitrogen concentration layer represented by a compositional formula of $A_aB_bO_oN_n$ (a+b+o+n=5) satisfied o>2.0 and n<1.0.

Comparative Example 1

In Comparative example 1, a Si substrate formed with a first electrode made of Cu formed by spattering was prepared, and the first electrode was provided so as to face against the target for forming thin film. Then, the dielectric layer was formed so that the thickness was 400 nm by a PLD method. While forming the dielectric layer, oxygen gas and nitrogen radicals were introduced, thereby a $SrTaO_2N$ type oxynitride was formed. In this comparative example, the Si substrate was heated to 700° C. in advance and then the formation of the dielectric layer was started. A length of time for forming the dielectric layer was 2 hours. Once the dielectric layer was formed, heating was also stopped and the temperature was decreased to room temperature by natural heat dissipation.

Comparative Example 2 and Comparative Example 3

In Comparative example 2 and Comparative example 3, a dielectric layer was formed as similar to Comparative example 1 except that a Si substrate formed with a first electrode made of Pt by spattering was prepared, and a nitrogen radical concentration was varied so that α, β, and α/β satisfied values shown in Table 1.

Further, for each Example and Comparative example, a nitrogen concentration in a region of the dielectric layer contacting the first electrode layer and a nitrogen concentration in a middle region of the dielectric layer were measured. Specifically, for the region of the dielectric layer contacting the first electrode layer and the middle region of the dielectric layer, the nitrogen concentration at three points were measured by an X-ray photoelectron spectroscopy, and then the average thereof was calculated. Results are shown in Table 1. In Table 1, N.D. refers to "Not Detected" (below detection limit).

Also, a metallic gloss of the dielectric layer was verified visually. Further, an outer appearance of the dielectric layer was observed using a microscope at a magnification of 1000×. Results are shown in Table 1.

Further, the surface roughness of the dielectric layer at the first electrode side was quantified. First, the obtained sample was cut at a cross section parallel to the thickness direction of the dielectric layer. Next, the cross section of the sample was observed using TEM at a magnification of 50000×, and a boundary between the dielectric layer and the first electrode was identified (the bold line shown in FIG. 4). Then, two points on the boundary were determined (point A and point B shown in FIG. 4). Note that, the length of straight line between the two points (broken line shown in FIG. 4) was set to 1 μm or more. Further, a length of the boundary between the two points (L1) and a length of straight line between the two points (L2) were calculated using image software, and the surface roughness of the dielectric layer was obtained from {(L1−L2)/L2}×100. Results are shown in Table 1. In the present experiment examples, the surface roughness of the dielectric layer of 2.0 μm or less was considered good.

Figure 2:
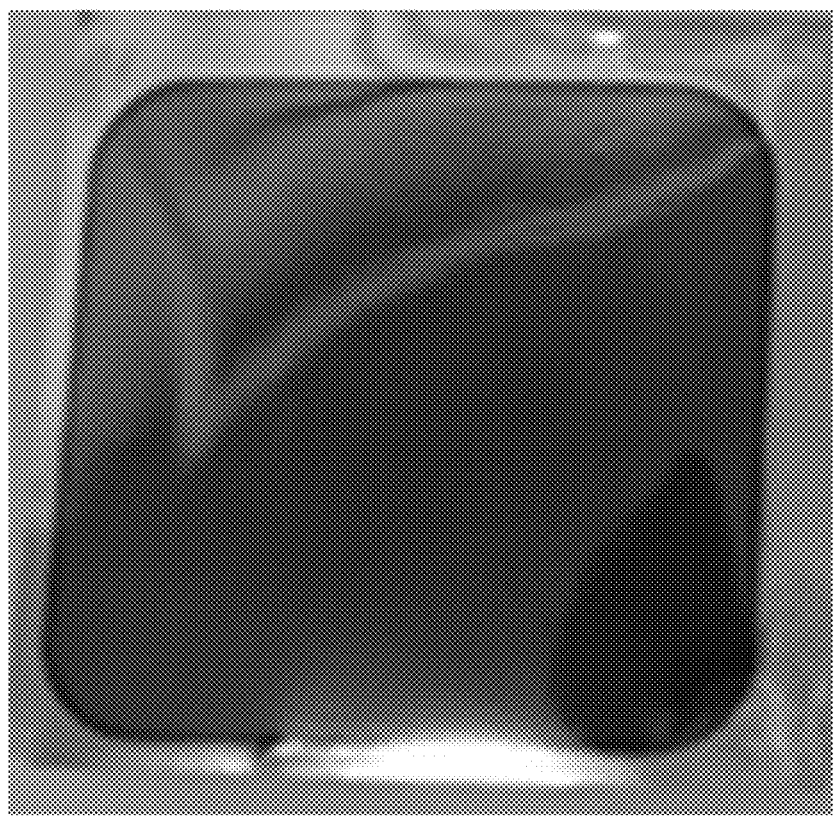
FIG. 2 is a photograph of a dielectric layer of Example 1.
Figure 3:
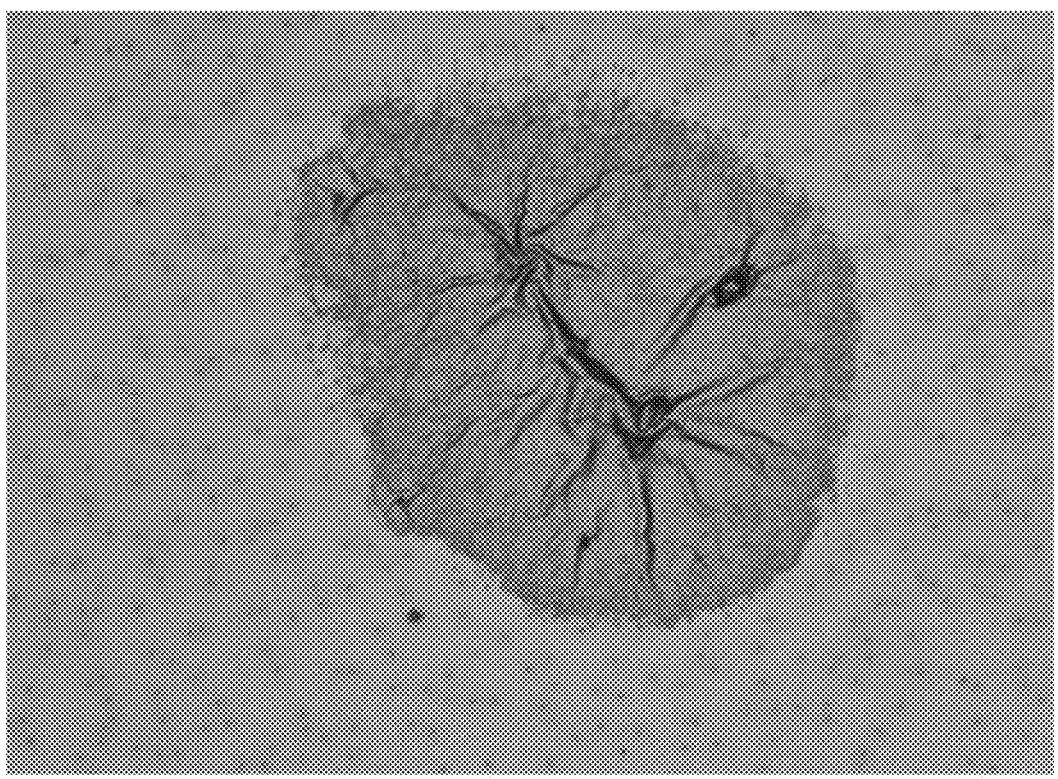
FIG. 3 is a photograph of a dielectric layer of Comparative example 1.

Also, results of the image of the dielectric layer of Example 1 is shown in FIG. 2. A size of the sample shown in FIG. 2 was 10 mm×10 mm. Results of the outer appearance observation of the dielectric layer of Comparative example 1 under a magnification of 500× is shown in FIG. 3.

Further, a conductivity of the first electrode after formed with the dielectric layer was verified. Specifically, the conductivity was verified by four-terminal sensing. When a resistance was 10Ω or less, the conductivity was considered good; and when a resistance was 1Ω or less, the conductivity was considered even better. Results are shown in Table 1.

the first electrode 11 was half or less of the nitrogen concentration in the middle region of the dielectric layer. Also, as shown in FIG. 2, the dielectric layer of Example 1 showed a metallic gloss. On the other hand, in Comparative example 1, the nitrogen concentration in the region of the dielectric layer contacting the first electrode 11 was more than half the nitrogen concentration in the middle region of the dielectric layer. Further, Examples 1 to 3 did not show any outer appearance defect on the dielectric layer, and the conductivity of the dielectric layer was good. On the other hand, as shown in FIG. 3, Comparative example 1 did have an outer appearance defect on the dielectric layer, and further the dielectric layer had a poor conductivity. Also, the dielectric layer of Comparative examples 2 and 3 did show similar metallic gloss and also had a better conductivity compared to Comparative example 1. However, in Comparative examples 2 and 3, the nitrogen concentration in the region of the dielectric layer contacting the first electrode 11 was more than half of the nitrogen concentration in the middle region of the dielectric layer. Also, in Examples 1 to 3, the surface roughness of the dielectric layer at the first electrode side was small. On the other hand, in Comparative example 1, the dielectric layer itself was disconnected and the surface roughness of the dielectric layer at the first electrode side was unable to quantify. Comparative examples 2 and 3 did have an outer appearance defect of the dielectric layer as similar to Comparative example 1. Further, Comparative examples 2 and 3 had a large surface roughness of the dielectric layer at the first electrode side.

Example 4, Example 6, and Comparative Example 4

In Example 4, a Si substrate formed with a first electrode made of Cu formed by spattering was prepared, and the first electrode was provided so as to face against the target for forming thin film. Here, a molar ratio of Sr/Ta of the target for forming thin film was varied so that a1, b1, and a1/b1 were values shown in Table 2. Further, the dielectric layer was formed so that the thickness was 100 nm by a PLD method. While forming the dielectric layer, oxygen gas (oxygen partial pressure 2×10-3 Pa) and nitrogen radicals were introduced, thereby a $SrTaO_2N$ type oxynitride was formed. A nitrogen radical concentration was varied so that $\alpha$, $\beta$, and $\alpha/\beta$ satisfied values shown in Table 2. The

TABLE 1

| | | N concentration (at %) | | | Outer appearance | | | |
| | | Region contacting | | | | | | |
| Sample No. | Type of lower electrode | the lower electrode ($\alpha$) | Middle region ($\beta$) | $\alpha/\beta$ | Appearance defect | Surface roughness | Metallic gloss | First electrode conductivity |
| --- | --- | --- | --- | --- | --- | --- | --- | --- |
| Example 1 | Ni foil | 1 | 8 | 0.13 | None | 1.8 | Metallic gloss | Good |
| Example 2 | Cu on Si substrate | N. D. | 6 | N. D. | None | 1.5 | None | Good |
| Example 3 | Pt on Si substrate | N. D. | 9 | N. D. | None | 0.4 | Metallic gloss | Good |
| Comparative example 1 | Cu on Si substrate | 5 | 6 | 0.83 | Found | Unable to measure | None | Poor |
| Comparative example 2 | Pt on Si substrate | 8 | 8 | 1.00 | Found | 2.9 | Metallic gloss | Fair |
| Comparative example 3 | Pt on Si substrate | 20 | 23 | 0.87 | Found | 2.4 | Metallic gloss | Fair |

According to Table 1, in Examples 1 to 3, the nitrogen concentration in the region of the dielectric layer contacting dielectric layer having an amorphous structure was formed so that the thickness was 100 nm by a PLD method. Here, the temperature was at room temperature. Next, the Si substrate was heated to 700° C. in advance and then the formation of the first electrode and the dielectric layer was started. At this time, a gas pressure was set to the same gas pressure as in case of forming the dielectric layer at room temperature. The dielectric layer was formed until a total thickness of the dielectric layer formed at room temperature and the dielectric layer formed at 700° C. was 600 nm. Once the dielectric layer was formed, heating was also stopped and the temperature was decreased to room temperature by natural heat dissipation. Note that, Sr/Ta ratio (a1/b1) of the obtained dielectric layer was about the same as Sr/Ta ratio of the target for forming thin film.

Example 5

In Example 5, the dielectric layer was formed as similar to Example 4, Example 6, and Comparative example 4 except that a Si substrate formed with a first electrode made of Pt formed by spattering was prepared and the first electrode was provided so as to face against the target for forming film; and also α, β, α/β, a1, b1, and a1/b1 were varied to values shown in Table 2.

TABLE 2

| | | | | | N concentration(at %) | | | Outer appearance | | | First |
| | | | | | Region contacting | | | | | | |
| Sample No. | Type of lower electrode | a1 (at %) | b1 (at %) | a1/b1 | the lower electrode (α) | Middle region (β) | α/β | Appearance defect | Surface roughness | Metallic gloss | electrode conductivity |
| --- | --- | --- | --- | --- | --- | --- | --- | --- | --- | --- | --- |
| Comparative example 4 | Cu on Si substrate | 12 | 20 | 0.6 | 5 | 8 | 0.63 | Found | 4.2 | None | Good |
| Example 4 | Cu on Si substrate | 20 | 20 | 1.0 | 2 | 8 | 0.25 | None | 1.2 | None | Good |
| Example 5 | Pt on Si substrate | 26 | 20 | 1.3 | N. D. | 8 | N. D. | None | 0.8 | Metallic gloss | Good |
| Example 6 | Cu on Si substrate | 46 | 20 | 2.3 | N. D. | 8 | N. D. | None | 1.9 | None | Good |

According to Table 2, in Examples 4 to 6, the nitrogen concentration in the region of the dielectric layer contacting the first electrode was half or less of the nitrogen concentration in the middle region of the dielectric layer. On the other hand, in Comparative example 4, the nitrogen concentration in the region of the dielectric layer contacting the first electrode was more than half of the nitrogen concentration in the middle region of the dielectric layer. Further, Examples 1 to 3 did not have an outer appearance defect on the dielectric layer, the surface roughness of the dielectric layer at the first electrode side was small, and the first electrode had a good conductivity. On the other hand, Comparative example 4 had an outer appearance defect on the dielectric layer, and the surface roughness of the dielectric layer at the first electrode side was large.

NUMERICAL REFERENCES

1 . . . Thin film capacitor
11 . . . First electrode
11a . . . First electrode first layer
11b . . . First electrode second layer
13 . . . Dielectric layer
13a . . . Low nitrogen concentration layer
13b . . . High nitrogen concentration layer
15 . . . Second electrode
10 . . . Epoxy based resin substrate
20 . . . Resin layer
30 . . . Insulation coating layer
40 . . . Electronic component
50 . . . Metal wire
100 . . . Electronic circuit board

What is claimed is:

1. A thin film capacitor comprising a first electrode, a dielectric layer, and a second electrode,
wherein the first electrode includes Cu,
the dielectric layer includes an $ABO_2N$ type oxynitride,
a nitrogen concentration of the dielectric layer contacting the first electrode is half or less of a nitrogen concentration of a middle region of the dielectric layer,
the A element of the $ABO_2N$ type oxynitride is at least one selected from the group consisting of Sr, Ba, Ca, La, Nd, Na, and K,
the B element of the $ABO_2N$ type oxynitride is at least one selected from the group consisting of Ta, Nb, Ti, and W,
the dielectric layer includes a buffer layer contacting the first electrode,
the buffer layer contacting the first electrode includes an amorphous structure,
the buffer layer includes the A element of the $ABO_2N$ type oxynitride and the B element of the $ABO_2N$ type oxynitride, and
a total content of the A element represented by a1 included in the buffer layer and a total content of the B element represented by b1 included in the buffer layer satisfies $1.3 \leq a1/b1 \leq 2.5$.

2. The thin film capacitor according to claim 1, wherein the $ABO_2N$ type oxynitride represented by a compositional formula of $A_aB_bO_oN_n$ (a+b+o+n=5) satisfies n<1.0.

3. The thin film capacitor according to claim 1, wherein the total content of the A element represented by a1 included in the buffer layer and the total content of the B element represented by b1 included in the buffer layer satisfies $1.3 \leq a1/b1 \leq 2.3$.

4. The thin film capacitor according to claim 1, wherein the dielectric layer is in direct physical contact with Cu of the first electrode and part of Cu is oxidized.

5. An electronic circuit board comprising an epoxy based resin substrate, a resin layer formed on the epoxy based resin substrate, the thin film capacitor according to claim 1 provided on the resin layer, an insulation coating layer formed on the resin layer, an electronic component provided on the insulation coating layer, and a metal wire connecting to the thin film capacitor or the electronic component.

* * * * *